United States Patent
Prest et al.

(10) Patent No.: US 9,622,357 B2
(45) Date of Patent: Apr. 11, 2017

(54) METHOD FOR ORIENTING DISCRETE PARTS

(71) Applicant: Apple Inc., Cupertino, CA (US)

(72) Inventors: Christopher D. Prest, Cupertino, CA (US); Jonah A. Harley, Cupertino, CA (US); Stephen B. Lynch, Cupertino, CA (US); Stephen P. Zadesky, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 138 days.

(21) Appl. No.: 14/271,057

(22) Filed: May 6, 2014

(65) Prior Publication Data
US 2015/0327370 A1  Nov. 12, 2015

(51) Int. Cl.
*H05K 13/00* (2006.01)
*H05K 3/30* (2006.01)
*H05K 3/00* (2006.01)
*C23C 16/44* (2006.01)
*H05K 13/02* (2006.01)
*H05K 13/04* (2006.01)

(52) U.S. Cl.
CPC ............. *H05K 3/303* (2013.01); *C23C 16/44* (2013.01); *H05K 3/0091* (2013.01); *H05K 13/0015* (2013.01); *H05K 13/022* (2013.01); *H05K 13/04* (2013.01); *H05K 2201/10106* (2013.01); *H05K 2203/1173* (2013.01); *H05K 2203/122* (2013.01); *H05K 2203/167* (2013.01); *Y02P 70/613* (2015.11)

(58) Field of Classification Search
USPC ......................................... 427/58, 98.4–98.6
See application file for complete search history.

(56) References Cited

U.S. PATENT DOCUMENTS

| | | |
|---|---|---|
| 3,434,354 A | 3/1969 | Voge |
| 3,877,298 A | 4/1975 | Narang |
| 4,219,936 A | 9/1980 | Bridges |
| 4,245,496 A | 1/1981 | Napetschnig |
| 4,277,174 A | 7/1981 | Kleesattel |
| 4,564,408 A | 1/1986 | Crumbach et al. |
| 4,596,349 A | 6/1986 | Herten |
| 4,848,141 A | 7/1989 | Oliver et al. |

(Continued)

FOREIGN PATENT DOCUMENTS

| | | |
|---|---|---|
| CN | 101313224 | 11/2008 |
| CN | 201335849 | 10/2009 |

(Continued)

OTHER PUBLICATIONS

Mason et al., "A Generic Multielement Microsystem for Portable Wireless Applications," Proceedings of the IEEE, vol. 86, No. 8, pp. 1733-1746, Aug. 1998.

(Continued)

*Primary Examiner* — Brian K Talbot
(74) *Attorney, Agent, or Firm* — Joseph F. Guihan

(57) ABSTRACT

Systems and methods for positioning a component on a surface or substrate including the steps of applying a coating to a selected deposit area of the surface, each deposit area defining at least a portion of a perimeter of an alignment area, depositing an fluid on the coating, and depositing, dropping, or otherwise positioning the component above the alignment area are disclosed.

21 Claims, 14 Drawing Sheets

(56) References Cited

U.S. PATENT DOCUMENTS

| | | | |
|---|---|---|---|
| 5,479,827 A | 1/1996 | Kimura et al. | |
| 5,541,525 A | 7/1996 | Wood et al. | |
| 5,616,857 A | 4/1997 | Merck, Jr. et al. | |
| 5,891,744 A | 4/1999 | Lowrey et al. | |
| 5,892,157 A | 4/1999 | Syre | |
| 6,191,593 B1 | 2/2001 | Tartagni et al. | |
| 6,485,913 B1 | 11/2002 | Becker et al. | |
| 6,592,437 B1 | 7/2003 | Boyd et al. | |
| 6,644,160 B1 | 11/2003 | Boselli | |
| 6,884,641 B2 | 4/2005 | Bruley et al. | |
| 6,955,093 B2 | 10/2005 | Smith | |
| 7,032,806 B2* | 4/2006 | Rinne | B23K 3/0623 228/175 |
| 7,084,652 B2 | 8/2006 | Guo et al. | |
| 7,267,847 B2 | 9/2007 | Karamuk et al. | |
| 7,521,915 B2 | 4/2009 | Herchen | |
| 7,696,538 B2 | 4/2010 | Lee et al. | |
| 7,733,108 B2 | 6/2010 | Kanev et al. | |
| 7,830,267 B2 | 11/2010 | Veerasamy | |
| 7,968,878 B2 | 6/2011 | Aggarwal et al. | |
| 8,091,437 B2 | 1/2012 | Stumpf | |
| 8,156,794 B2 | 4/2012 | Konaka et al. | |
| 8,253,425 B2 | 8/2012 | Reynolds et al. | |
| 8,821,965 B2* | 9/2014 | Duerig | B82Y 30/00 427/197 |
| 8,868,147 B2 | 10/2014 | Stippick et al. | |
| 8,938,993 B2 | 1/2015 | Harper et al. | |
| 8,996,166 B2 | 3/2015 | Jenkinson | |
| 9,086,386 B1 | 7/2015 | Rutherford et al. | |
| 2005/0181143 A1* | 8/2005 | Zhang | B82Y 30/00 427/532 |
| 2006/0139041 A1 | 6/2006 | Nystrom et al. | |
| 2009/0178273 A1* | 7/2009 | Lauffer | H05K 1/142 29/830 |
| 2009/0242457 A1 | 10/2009 | Kou | |
| 2010/0249306 A1* | 9/2010 | Berndt | H01B 7/2825 524/404 |
| 2011/0195187 A1* | 8/2011 | Weber | C23C 14/12 427/248.1 |
| 2012/0275088 A1* | 11/2012 | Huang | B05D 5/10 361/679.01 |
| 2013/0333485 A1 | 12/2013 | Shah | |
| 2014/0090480 A1 | 4/2014 | Adams et al. | |
| 2014/0360252 A1* | 12/2014 | Yamamoto | B81C 1/00 73/64.48 |
| 2015/0070037 A1 | 3/2015 | Pragada et al. | |
| 2015/0268273 A1 | 9/2015 | Pragada et al. | |

FOREIGN PATENT DOCUMENTS

| | | |
|---|---|---|
| CN | 101617241 | 12/2009 |
| CN | 102081110 | 6/2011 |
| CN | 104359769 | 2/2015 |
| EP | 1834905 | 9/2007 |
| JP | 2011-227814 | * 11/2011 |
| WO | WO2012/067126 | 5/2012 |

OTHER PUBLICATIONS

Schlaak et al., "Micromechanical Capacitive Acceleration Sensor with Force Compensation," Micro Systems Technologies 90, pp. 617-622, 1990.

* cited by examiner

METHOD FOR ORIENTING DISCRETE PARTS

TECHNICAL FIELD

Embodiments described herein generally relate to methods for orienting and aligning discrete parts during manufacture, and more particularly, to methods for orienting and aligning surface mount electronic components at select locations on a substrate.

BACKGROUND

Many electronic devices include circuitry composed of a number of discrete electronic parts connected by electrically conductive paths. As electronic devices have become more compact and durable, many electronic circuits have become increasingly composed of a plurality of surface mounted parts. For example, some electric devices may include a backlight for a display comprised of a large number surface mounted light emitting diodes distributed evenly upon a surface. In some examples, surface mounted parts may require particular orientation, position, or alignment in order to function properly.

Traditional techniques for orienting surface mounted parts during the manufacture of electronic device circuitry may include the use of one or more automated placement machines (e.g., pick and place robotics). Typically, an automated placement machine may require individual components to be supplied to the machine via a tape or paper feed, each component positioned along the feed in a particular orientation and separated some distance from the next component.

Alternate techniques arrange individual components in a tray accessible by the placement machine. In further examples, the automated placement machine may use optical sensors to detect one or more alignment fiducials on individual electronic components in order to appropriately orient the component before placement.

However, automated placement machines and the associated tape feeds, components trays, and alignment fiducials may increase production complexity and cost. For example, tape feeds and trays may require frequent replenishment that may require monitoring and periodic stoppage of at least a portion of the production line. In other cases, surface mount components of small size may not be large enough to include alignment fiducials of a size sufficient to be detected by optical sensors. These among other limitations may be especially problematic for small form factor electronic devices.

Accordingly, there may be a present need for methods for orienting and aligning discrete parts.

SUMMARY

Embodiments described herein may relate to or take the form of systems and methods for positioning a component on a surface or substrate including the steps of applying a coating to a selected deposit area of the surface, each deposit area defining at least a portion of a perimeter of an alignment area, depositing an fluid on the coating, and depositing, dropping, or otherwise positioning the component above the alignment area.

In further embodiments, the surface may be agitated to encourage the component to align with the alignment area. Thereafter, in certain further embodiments, the fluid may be removed. Still further embodiments may cure the fluid to permanent or temporary rigidity.

Other embodiments may include a configuration in which the fluid is a fluid, such as water or oil. Related embodiments may include a coating such as an oleophilic or hydrophilic coating.

Further embodiments may include a configuration in which depositing the fluid includes immersing the coated surface in a bath of fluid. In other cases, depositing the fluid may include a vapor deposition process.

Additional embodiments described herein may have a configuration including a low surface energy coating deposited upon at least one external surface of the component, for example, a hydrophobic or oleophobic coating.

Further embodiments described herein may relate to or take the form of methods for of positioning a component on a surface including the steps of applying a first coating to a selected area of the surface, the coating defining at least a portion of the perimeter of an alignment area, applying a second coating to an exterior surface of the component, depositing an fluid on each of the first coating and second coating, and depositing the component above the alignment area such that the fluid deposited on the first coating and the fluid deposited on the second coating interface.

BRIEF DESCRIPTION OF THE FIGURES

Reference will now be made to representative embodiments illustrated in the accompanying figures. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

The use of the same or similar reference numerals in different figures indicates similar, related, or identical items.

DETAILED DESCRIPTION

Figure 1:
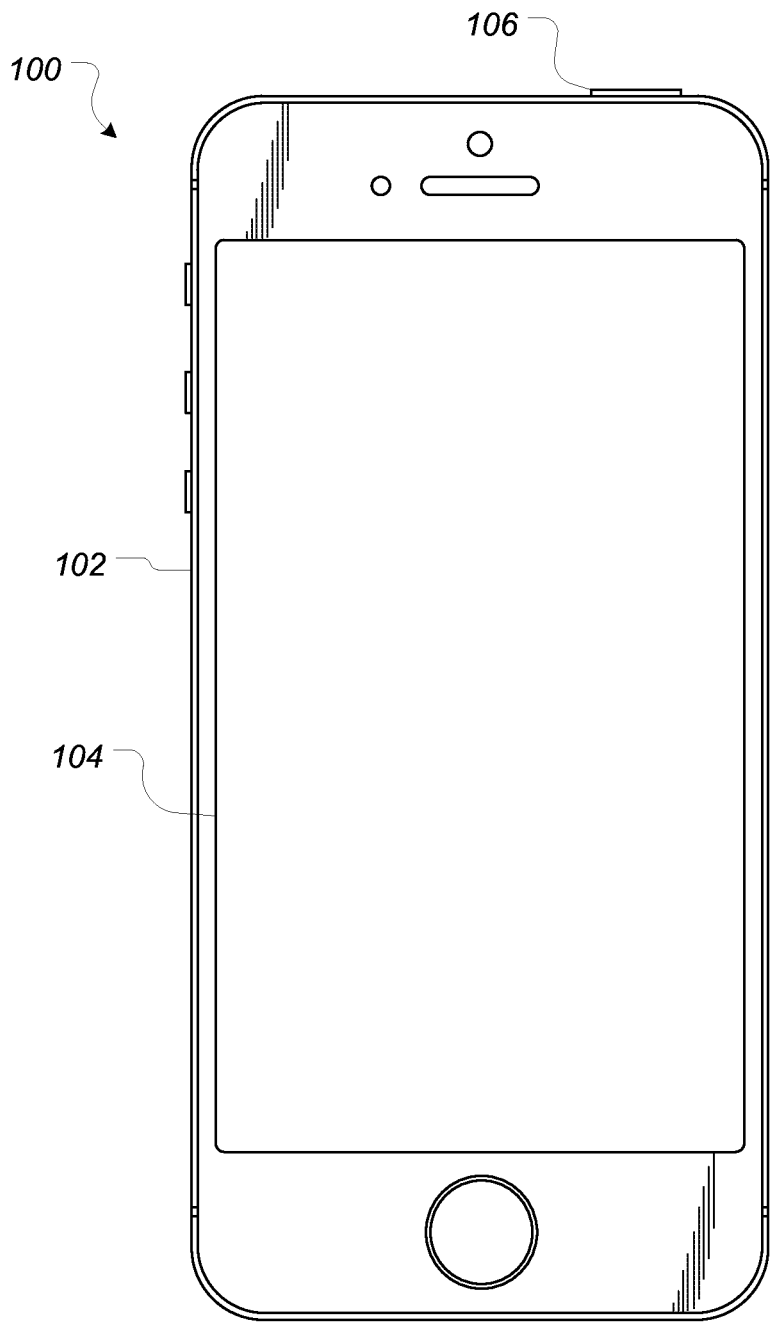
FIG. 1 depicts a front view of a sample electronic device.

Embodiments discussed herein may relate to or take the form of systems and methods for positioning a component on a surface or substrate.

In certain examples, a fluid may be selectively deposited along the surface of a substrate in order to form an alignment guide for depositing and orienting a component that may be permanently or semi-permanently affixed to the substrate in a subsequent process. As a non-limiting example, components that may be aligned or oriented via techniques and methods described herein may include light emitting diodes, resistors, capacitors, inductors, semiconductors, transistors, diodes, force sensors, crystalline clock elements, switch elements, connector elements, optical sensors, magnetic sensors, acoustic elements, aesthetic elements, shielding elements, lensing elements, mechanical elements, magnetic elements, input elements and so on. Although many embodiments described herein include discussion of electronic circuit components, one may appreciate that the underlying system and method of orienting and arranging said components may likewise apply to other parts or affixations.

In some embodiments, an alignment guide may be formed by arranging a number distinct deposit points along on the surface of a substrate. In many examples, the deposit points may not overlap, however, in certain embodiments the deposit points may selectively overlap or interface. The deposit points may be arranged about a central point or area to form a selected geometry between them.

In some examples, three deposit points may define a triangular alignment guide, four deposit points may define a square alignment guide, five deposit points may define a pentagonal alignment guide, and so on. In this manner, the positioning of the deposit points may define the size and shape of the alignment guide. In other words, the positioning of the deposit points may define a target alignment area. Further, as the size and shape of the deposit points change, alternative volumes and shapes of fluid may be applied.

Once the multiple deposit points are arranged on the surface, a selected volume of fluid may be applied to each deposit point. One may appreciate that the curvature of each water bead at each deposit point depends directly upon the volume of water applied to the coating. For example, in some embodiments, the fluid selected may be water. In such a case, the volume of water deposited to each of the deposit points may be selected such that the surface tension of the water maintains a spherical or substantially spherical shape. One may appreciate that a small volume of water may not be substantially spherical, but may form, for example, an oblate spheroid. Alternatively, a large volume of water may be too massive for the surface tension to maintain a unified spherical shape, causing the volume to split into multiple drops.

In order to encourage deposited liquid to maintain its position at the selected deposit points, each deposit point may be coated with a material to facilitate adhesion of the fluid to the surface of the deposit point. For example, when that the fluid is water, the coatings on the deposit points may be formed of a hydrophilic material to encourage the water to bead at the deposit points. Alternatively, the coatings may be positioned around or adjacent to deposit points may be formed of a hydrophobic material to encourage the water to bead at the deposit points.

As may be appreciated, the relative hydrophilicity of a solid surface correlated to the surface energy of the solid, which may be characterized by the contact angle formed between the surface and the curvature of a water droplet placed thereon. If the contact angle is particularly high (e.g., the widest portion of the water droplet curves inwardly toward an edge or point at which the water droplet and surface contact one another), the surface is hydrophobic. Alternately, if the contact angle is particularly low (e.g., the water droplet curves outwardly towards the edge or point that the water droplet and surface contact one another), the surface is hydrophilic.

Although many embodiments described herein refer to water as the fluid used for alignment, in alternate embodiments, an alignment guide may be formed with liquid oil. In such a case, coatings on the deposit points may be formed from an oleophilic material to encourage the oil to bead at the deposit points. As with hydrophobicity, one may appreciate that the curvature of each oil bead at each deposit point typically depends on the volume of oil applied thereto and to the oleophilicity of the material selected for the coating.

The specific angular definitions of "hydrophobic" and "hydrophilic" or, in the alternative, "oleophobic" and "oleophilic" or, more generally, "fluid repellant" and "fluid adherent", may vary from embodiment to embodiment. Similarly, different naming conventions may assign different angular ranges defining hydrophobicity and hydrophilicity, or in the alternative oleophobicity and oleophilicity. Accordingly, and as used herein, the terms "hydrophobic", "hydrophilic", "oleophobic", "oleophilic", "fluid repellant" and "fluid adherent" and related terms, phrases, and equivalents refer to relative high or relative low surface energy materials suitable to attract or adhere, or in the alternative repel or resist, at least one type of fluid.

After an alignment guide is defined by forming the deposit points and alignment fluid, a component may be positioned above the alignment guide. For example, in certain embodiments, the component may be dropped, placed, or otherwise released above the alignment guide. As the component impacts one or more of the beads of fluid, the geometry of the alignment guide (e.g., position of the water or oil beads) may influence the component to take a desired orientation.

For example, in some embodiments the component may take the shape of a conical cylinder or other heightened component. In such an embodiment, three or more deposit points may be positioned to define a particular geometry of void space between the beads of fluid. The void space may be positioned about the portion of the substrate with which the component should be preferably aligned. In this manner, the beads of alignment fluid form a size-limiting guide such that any component larger than the void space will not pass through but that any component sized smaller than the void space will, presuming the component's mass is insufficient to break the surface tension of the fluid beads. Generally, small (on the order of microns to hundreds of microns) and/or light (on the order of milligrams or micrograms) components may be aligned by a fluid or fluid beads as described herein, although other embodiments may facilitate alignment of larger and/or heaver components. In the example of a conical cylinder, the smaller diameter end may be sized to fit within the void space whereas the large diameter end may not. In this manner, as the conical cylinder is dropped, placed, or otherwise positioned above the deposit points, the cylinder may slide inverted into the void space. In still further embodiments, other geometries and shapes may be used. For example, suitable alignment geometry may include a square, rectangular, or cubic shape, pyramidal, trapezoidal shapes, spherical shapes, and so on.

In certain further examples, the substrate or component may be agitated in order to encourage the component to orient with respect to the alignment guide. Agitation may be accomplished in any of a number of suitable ways. For example, the substrate may be pushed or vibrated. Other methods of agitation may include, without limitation, sonication, magnetic agitation, chemical agitation, airburst agitation, and so on.

In still further alternate embodiments, the component may be encouraged to assume a particular orientation prior to impacting the alignment guide. For example, certain components may be coated partially or entirely with a permanent magnetic material. In such an example, the plurality of components may be passed through an electromagnetic field such that each component aligns in the same direction prior to impacting the alignment guide. In other examples, components may be electrostatically charged to align in a particular orientation prior to impacting the alignment guide.

In still further examples, the alignment fluid may be accumulated after a component or a plurality of components has been deposited along the surface of the substrate. For example, a component may be placed on a substrate which may itself be placed in a bath of alignment fluid. As fluid accumulates on one or more of the deposit points, the component may be encouraged, raised, or shifted into an aligned position.

In still further examples, a current may be induced in the fluid that encourages a particular orientation or alignment of a component. In further examples, a component may include a buoyant portion or section such that the component may orient itself if at least partially submerged within a fluid.

In still further embodiments, the alignment fluid may be removed after the component is aligned. In some examples, the alignment fluid may be evaporated. In other examples, the alignment fluid may be brushed, blown, or otherwise moved away from the substrate.

In alternate examples, the alignment fluid may be cured to permanent or temporary rigidity after the alignment fluid is deposited on the substrate.

FIG. 1 depicts a front view of a sample electronic device including at least one electronic circuit having multiple discrete components. The electronic device 100 may, for example, be embodied as portable or handheld electronic devices, such as a smart phone having a housing 102 and a display area 104 that consumes a majority or all of the front surface of the electronic device 100. The electronic device may include one or more physical buttons 106 that a user may engage to interact with the electronic device 100. Although FIG. 1 depicts the electronic device as a cellular smart phone, other electronic devices may employ the methods and techniques, or the results thereof, for orienting discrete parts as described herein. For example, such electronic devices may include personal digital assistants, tablet computers, laptop computers, track pads, wearable devices, health devices, sports accessory devices, peripheral input devices, dashboards, appliances, and so on.

The display area 104 of electronic device 100 may be embodied in a variety of ways. In one example, the display area 104 may consist of at least a display and a backlight. The display may include a flat panel display such as, for example, a liquid crystal display or a thin film transistor display. The backlight may be positioned behind the display such that light emitted from the backlight illuminates the display. Back light elements may include a cold cathode fluorescent lamp ("CCFL"), an edge-lit light emitting diode ("LED") array, a flat LED matrix backlight, organic light emitting diodes ("OLED"), and so on.

Figure 2A:
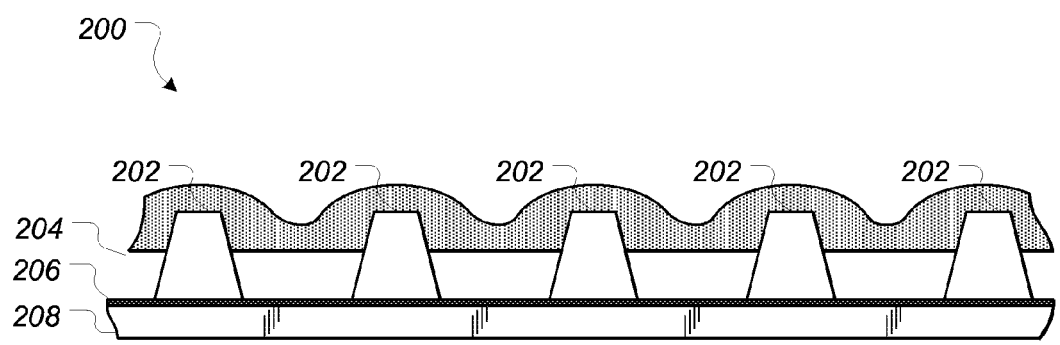
FIG. 2A depicts a simplified schematic side view of a cross section of a sample embodiment in which multiple electronic components share a common orientation.

FIG. 2A depicts a side view of a cross section of a backlight 200 for a display that may be included in an electronic device 100 as shown in FIG. 1. The backlight 200 may include multiple electronic components that share a common orientation. In such an embodiment, the backlight 200 may include a plurality of light emitting diodes 202. As illustrated, each light emitting diode 202 may have a substantially trapezoidal cross section. Each of the light emitting diodes 202 may be oriented in the same direction and positioned at regular intervals along a substrate 208. A first electrode layer 206 is positioned between the substrate 208 and the plurality of light emitting diodes 202. In certain embodiments, the first electrode layer 206 is made from a transparent or semitransparent electrically conductive material, such as indium tin oxide. A second electrode layer 204 may be formed above each of the plurality of light emitting diodes 202. In many examples, the second electrode layer 204 may be formed from silver ink or another suitable conductor. In this manner, an electrical circuit is completed between the first electrode layer 204, the plurality of light emitting diodes 202, and the second electrode layer 206. Thus, when an electrical current is applied to the first electrode layer 206 and the second electrode layer 204 is connected to a circuit ground, each of the plurality of light emitting diodes 202 illuminate.

One may appreciate that select circuit elements may require a particular electrical polarity to function within an electrical circuit. For example, a light emitting diode may only emit light if a positive voltage of a particular magnitude is applied to the anode of that element. Accordingly it may be advantageous to align each of the plurality of light emitting diodes 202 in the same orientation in order to emit light at the same time.

Figure 2B:
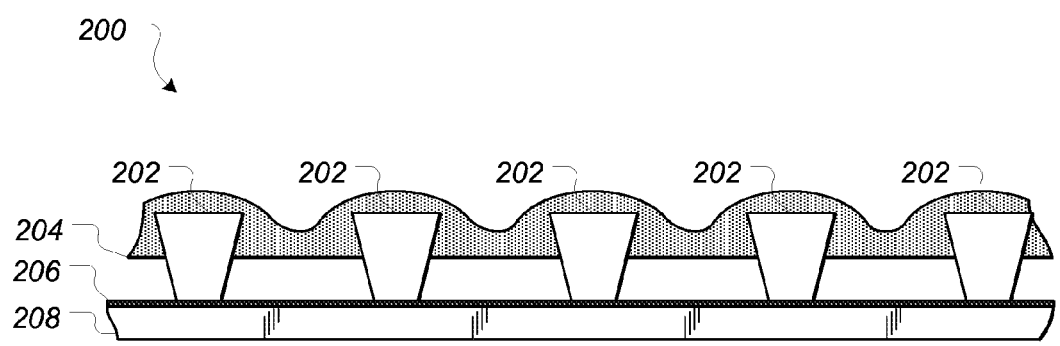
FIG. 2B depicts a simplified schematic side view of a cross section of a sample embodiment in which multiple electronic components share an alternative common orientation.

The actual orientation of the light emitting diodes 202 may vary from embodiment to embodiment so long as the orientation of each light emitting diode 202, or a majority thereof, is the same. For example, FIG. 2B depicts a side view of a cross section of a sample embodiment in which the plurality of light emitting diodes 202 share an alternative common orientation, such as on its side.

Figure 3:
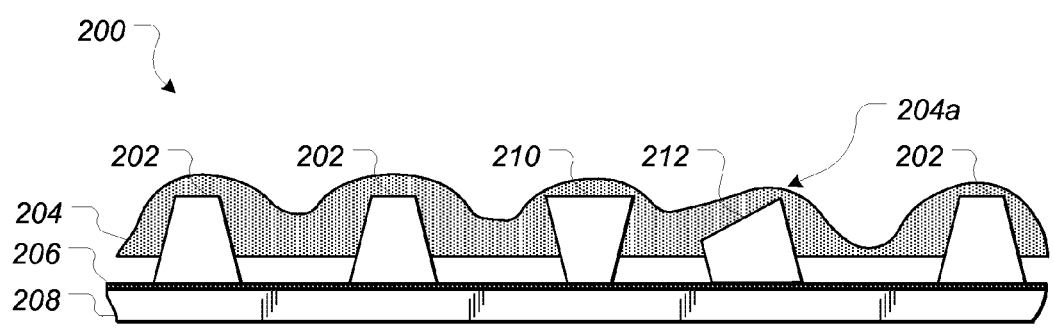
FIG. 3 depicts a simplified schematic side view of a cross section of a sample embodiment in which certain electronic components are incorrectly oriented.

However, in certain cases, the plurality of light emitting diodes may not uniformly orient during manufacturing and/or processing operations. For example, FIG. 3 depicts a side view of a cross section of a sample embodiment in which certain electronic components are incorrectly oriented. As shown, a light emitting element 210 may be oriented oppositely from the rest of the plurality of light emitting diodes 202. In addition, a light emitting diode 212 may be oriented in a third orientation.

One may appreciate that the non-uniform orientation of the light emitting diodes 210, 212 may cause the backlight 200 to be rejected during manufacture. For example, due to dissimilar electrical polarity, the light emitting diodes 210, 212 may not illuminate with the plurality of light emitting diodes 202, effecting dark spots at certain locations along backlight 200. In other examples, the orientation of light emitting diodes 210, 212 may cause undesirable deformations such as deformity 204a.

Figure 4A:
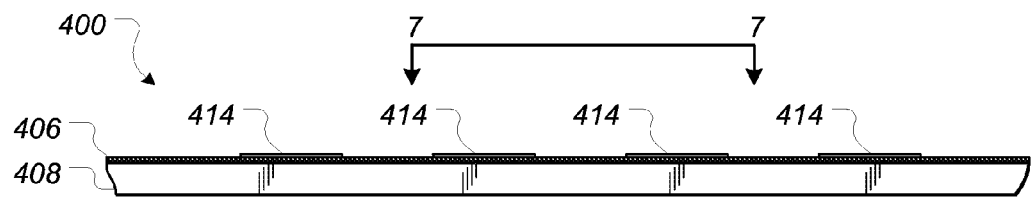
FIG. 4A depicts a simplified schematic side view of a cross section of a sample embodiment in which a high surface energy coating is disposed at select separated locations along a substrate.

FIG. 4A depicts a side view of a cross section of a substrate stack 400. The substrate stack 400 may include a first electrode layer 406 disposed above a substrate 408. Disposed above the first electrode layer 406 are four deposit areas 414, each coated with a hydrophilic material. As noted above, in certain embodiments, the deposit areas 414 may be coated with an oleophilic or hydrophilic material or any other generally fluid adherent material. This is a sample embodiment only. Some embodiments may have more or fewer deposit areas laid out in any array or pattern.

Figure 4B:
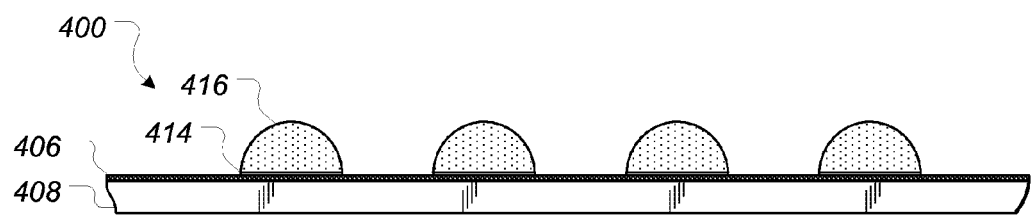
FIG. 4B depicts a simplified schematic side view of the cross section of the sample embodiment shown in FIG. 4A, showing a first accumulated volume of fluid at each high surface energy location disposed along the substrate.

FIG. 4B depicts a side view of the cross section of the sample embodiment shown in FIG. 4A, including a bead 416 at each deposit area 414 along the substrate stack 400. In many embodiments, each bead 416 may be water. In certain other embodiments, each bead may be oil or any other suitable fluid.

The beads 416 may be deposited using any suitable process including, but not necessarily limited to, vapor deposition, immersion, and condensation. Continuing to deposit water may cause each bead 416 to increase in volume. For example, FIG. 4C depicts a side view of the cross section of the sample embodiment shown in FIG. 4A, showing beads 416 having a larger volume than the beads as shown in FIG. 4B.

Figure 4C:
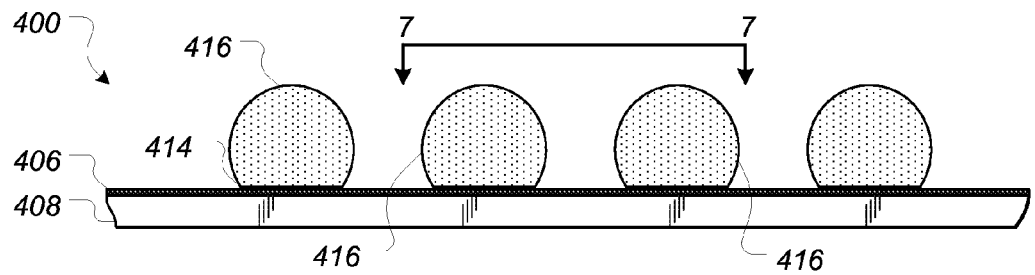
FIG. 4C depicts a simplified schematic side view of the cross section of the sample embodiment shown in FIG. 4A, showing a second accumulated volume of fluid at each high surface energy location disposed along the substrate.
Figure 5A:
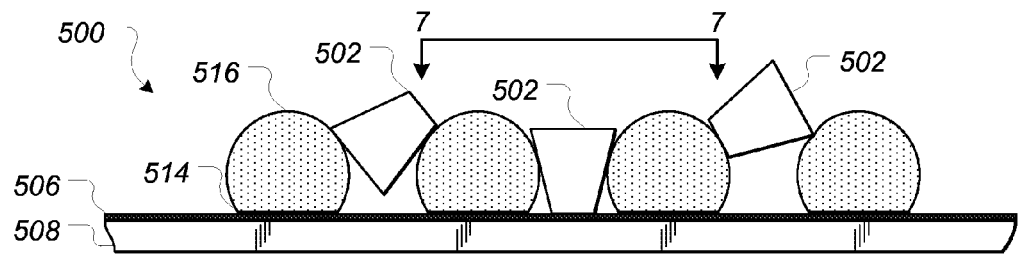
FIG. 5A depicts a simplified schematic side view of the cross section of the sample embodiment shown in FIG. 4C, showing multiple electronic components each in an arbitrary orientation and deposited over accumulated fluid.
Figure 5B:
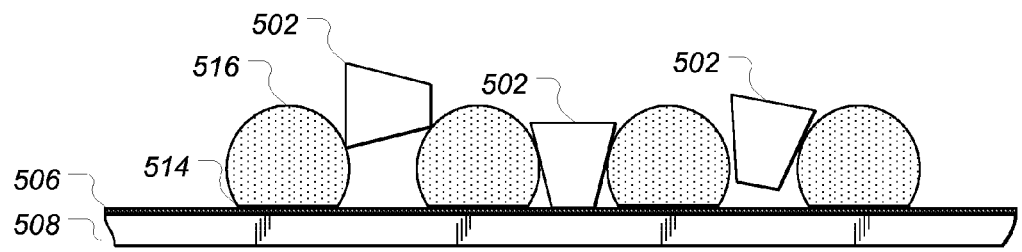
FIG. 5B depicts a simplified schematic side view of the cross section of the sample embodiment shown in FIG. 5A, showing the multiple electronic components in a second orientation after a first agitation of the substrate.
Figure 5C:
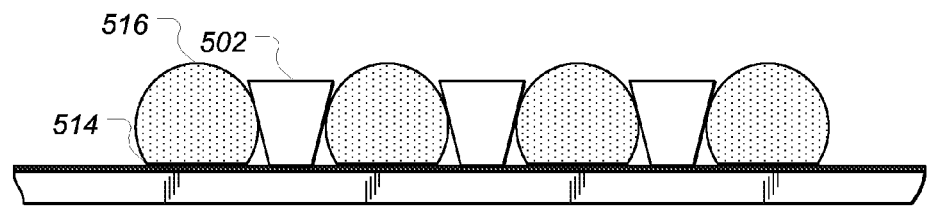
FIG. 5C depicts a simplified schematic side view of the cross section of the sample embodiment shown in FIG. 5A, showing the multiple electronic components in a uniform orientation after additional agitation of the substrate.
Figure 5D:
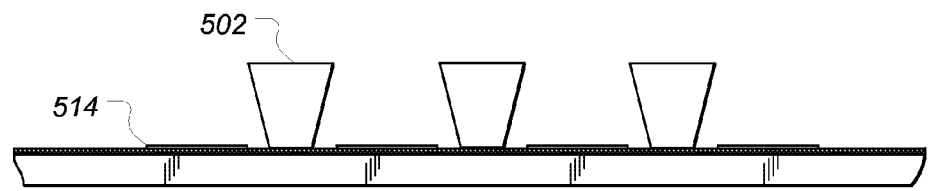
FIG. 5D depicts a simplified schematic side view of the cross section of the sample embodiment shown in FIG. 5A, showing the multiple electronic components in a uniform orientation after removal of the fluid.

FIG. 5A depicts a side view of the cross section of the sample embodiment shown in FIG. 4C, showing a number of light emitting diodes 502 positioned above the beads 516, in arbitrary orientations. As illustrated, only a certain number of light emitting diodes 502 orient properly within the area between each the beads 516. Accordingly, in certain embodiments, agitation of the substrate may be advantageous to encourage the light emitting diodes 502, or a majority thereof, to orient uniformly. For example, FIGS. 5B-5C show example orientations of the light emitting diodes 502 after agitation. After agitation, the beads 516 may be removed as shown in FIG. 5D.

In many embodiments, each of the light emitting diodes 502 may be coated fully or partially with a fluid repellant coating. In this manner, the light emitting diodes may repel or substantially repel the beads 516 to further encourage proper alignment. For example, a partial coating may be attracted or repelled from the beads 516 only in particular orientations. For example, a light emitting diode may have a repelling coating on a top surface and an attracting coating on a side or bottom surface. If disposed over the beads in an inverted orientation, the light emitting diode is encouraged to flip.

Figure 6A:
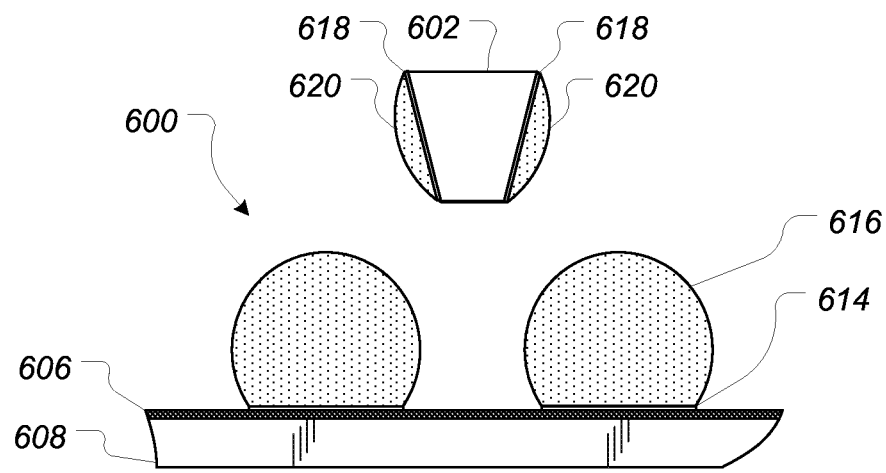
FIG. 6A depicts a simplified schematic side view of the cross section of the sample embodiment shown in FIG. 4C, showing an electronic component with a high surface energy coating and a volume of fluid attracted thereto, deposited over an accumulated volume of fluid.
Figure 6B:
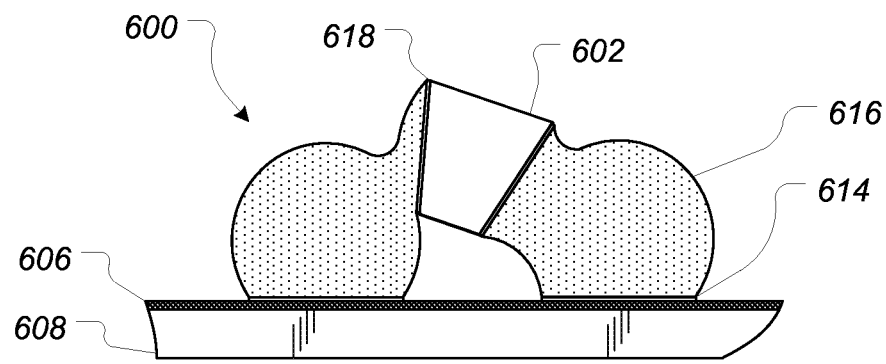
FIG. 6B depicts a simplified schematic side view of the cross section of the sample embodiment shown in FIG. 6A, showing the electronic component guided toward an aligned position by coalescence of the fluid accumulated along to the electronic component and the fluid accumulated along the substrate.
Figure 6C:
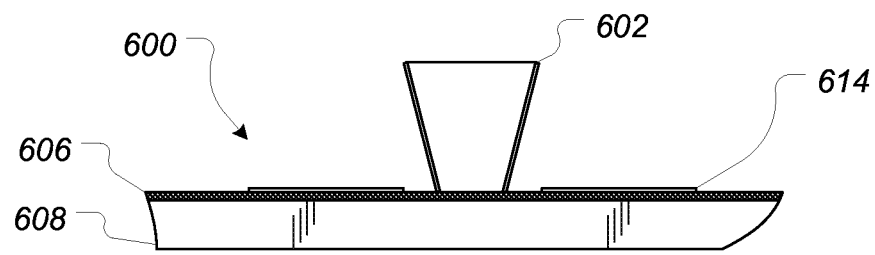
FIG. 6C depicts a simplified schematic side view of the cross section of the sample embodiment shown in FIG. 6B, showing the electronic component in the selected orientation after removal of the fluid.

FIG. 6A depicts a simplified schematic side view of a cross section of a substrate stack 600. The substrate stack 600 may include a first electrode layer 606 disposed above a substrate 608. Also illustrated is a light emitting diode 602. The light emitting diode 602 may be fully or partially coated with a hydrophilic coating 618 similar to or identical to the hydrophilic coating applied to the deposit area 614. In addition, the hydrophilic coating 618 may also affect a volume of water to form at least a partial bead 620. In this manner, as the light emitting diode 602 approaches the beads 616 adhered to the deposit areas 614, the beads 616, 620 may partially or completely coalesce with the water on the diode 602, as shown in FIG. 6B. In many examples, unwanted pockets of air may become trapped below the light emitting diode 602. In order to remove the unwanted pockets of air, the substrate stack 600 may be placed in a vacuum chamber; differential pressure between the pockets and the vacuum remove the air pockets. After undesirable pockets of air are removed, the beads 616 may be removed as shown in FIG. 6C, leaving the diode 602 properly oriented.

Figure 7A:
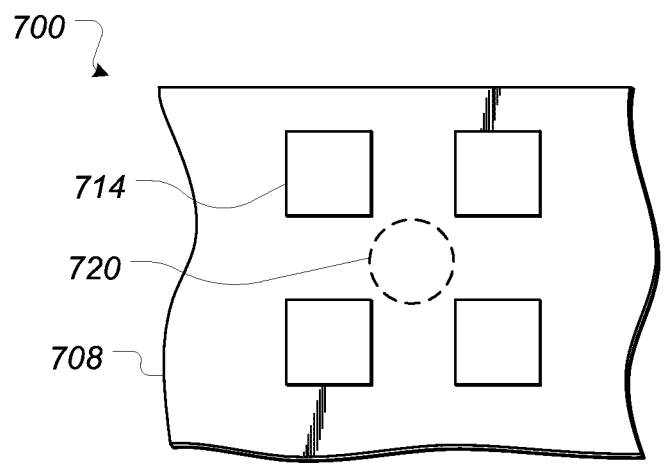
FIG. 7A depicts a top plan view shown along line 7-7 of the sample embodiment shown in FIG. 4A, showing multiple high surface energy coatings disposed at select separated locations along a substrate.

FIG. 7A depicts a top plan shown along line 7-7 of the sample embodiment shown in FIG. 4A, showing a substrate stack 700. The substrate stack 700 may include four sample deposit areas 714, each coated with a hydrophilic material. In other embodiments, more or fewer deposit areas can be included. As noted above, in certain embodiments, the deposit areas 714 may be coated with an oleophilic or hydrophilic material or any other generally fluid adherent material. Also shown is an alignment area 720, substantially at the midpoint of the square defined by the deposit areas 714.

Figure 7B:
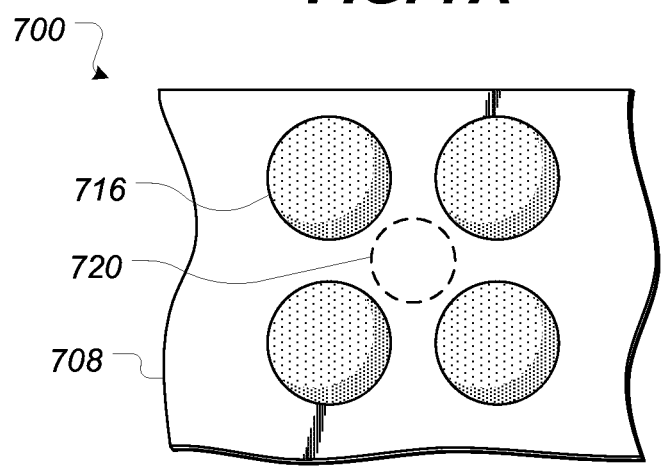
FIG. 7B depicts a top plan view shown along line 7-7 of the sample embodiment shown in FIG. 4C, including four separated volumes of an accumulated volume of fluid at each high surface energy location disposed along the substrate.

FIG. 7B depicts a top plan view shown along line 7-7 of the sample embodiment shown in FIG. 4C, including a bead 716 formed at each deposit area 714 along the substrate stack 700. In many embodiments, each bead 716 may be water. In certain other embodiments, each bead may be oil or other selected fluid.

Figure 7C:
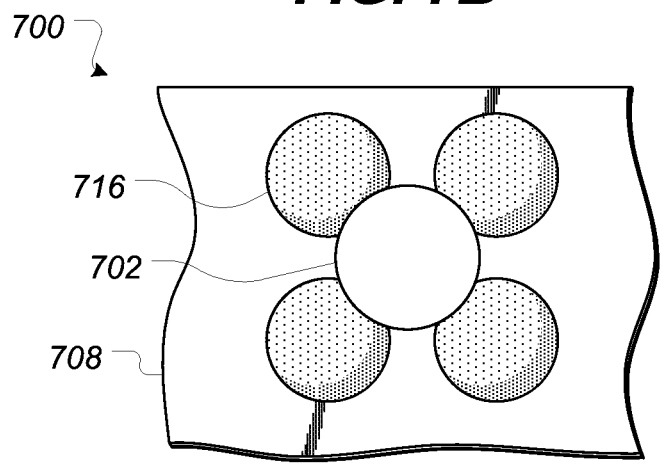
FIG. 7C depicts a top plan view shown along line 7-7 of the sample embodiment shown in FIG. 5A, showing an electronic component deposited over the accumulated volume of fluid.

FIG. 7C depicts a top plan view shown along line 7-7 of the sample embodiment shown in FIG. 5A, showing a light emitting diode 702 aligned over the alignment area 720.

Figure 8A:
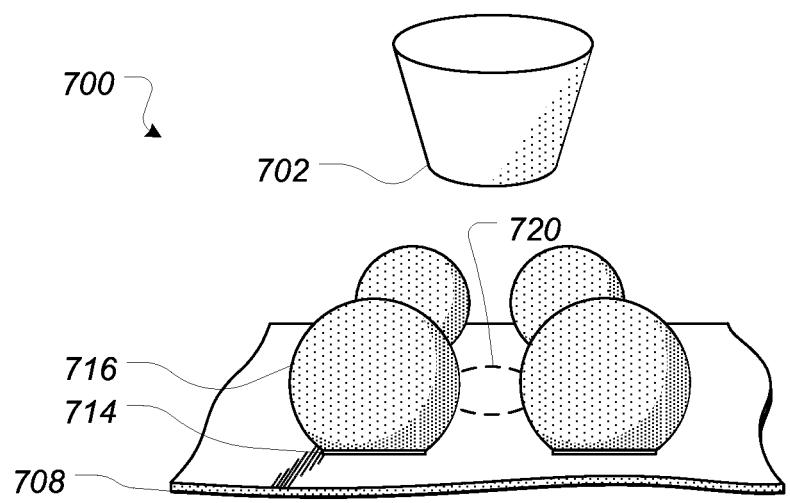
FIG. 8A depicts a front perspective view of the sample embodiment shown in FIG. 7B, showing an electronic component deposited above the accumulated volume of fluid.
Figure 8B:
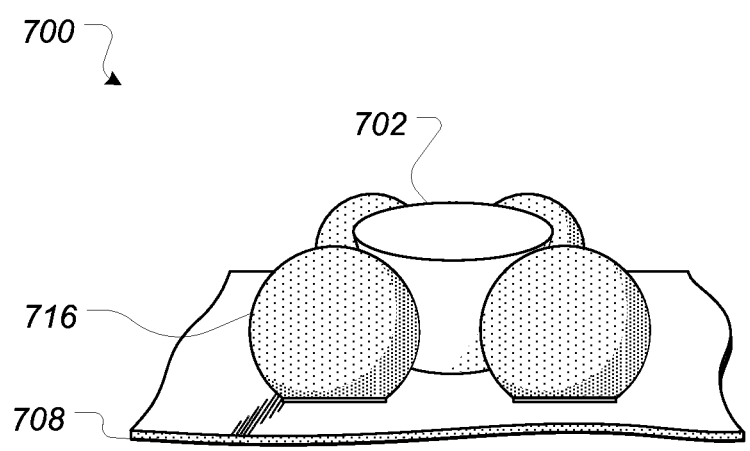
FIG. 8B depicts a front perspective view of the sample embodiment shown in FIG. 7B, showing an electronic aligned by an accumulated volume of fluid.

FIG. 8A depicts a front perspective view of the sample embodiment shown in FIG. 7B, including a bead 716 at each deposit area 714 along the substrate stack 700. In this manner, the light emitting diode 702 may be guided toward the alignment area 720 by the geometry defined by the placement of each deposit area 714 and associated bead 716, as shown in FIG. 8B.

Figure 8C:
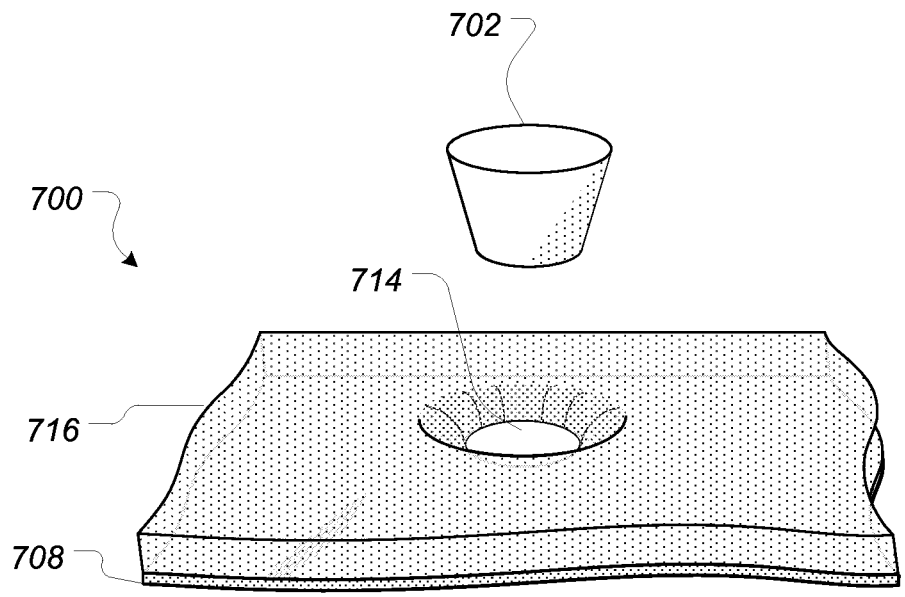
FIG. 8C depicts a front perspective view of an alternate sample embodiment showing an electronic component deposited above the accumulated volume of fluid.
Figure 8D:
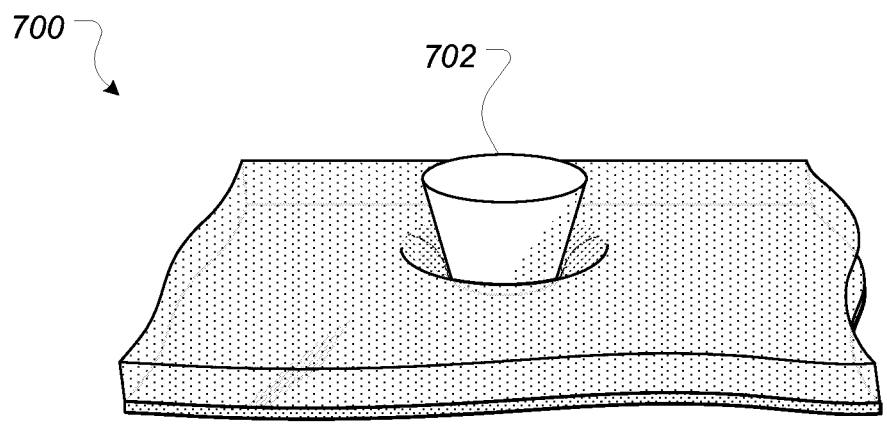
FIG. 8D depicts a front perspective view of an alternate sample embodiment showing an electronic component aligned within an accumulated volume of fluid.

In an alternate embodiment, the substrate stack 700 may be coated with a hydrophilic coating at all locations except within an alignment area 714 such that a fluid 716 may flow or accumulate over the entire surface of the substrate 708 except for the alignment area 714, as shown for example in FIGS. 8C-8D. In still further alternate embodiments, the alignment area 714 may be coated with a hydrophobic coating such that a fluid 716 may flow or accumulate over the entire surface of the substrate 708 except for the alignment area 714.

Figure 9A:
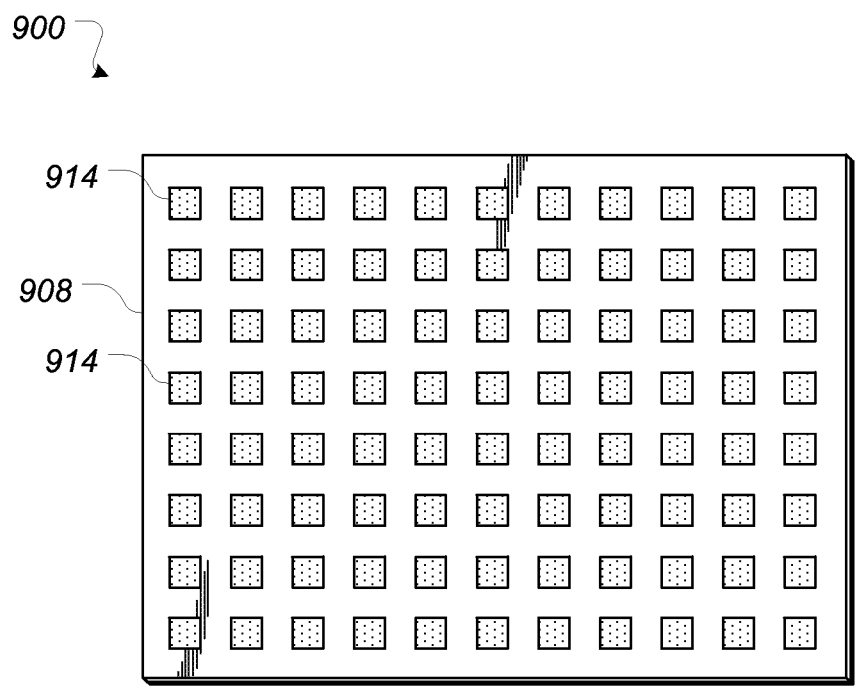
FIG. 9A depicts a top plan view of one sample embodiment of a substrate having a grid of high surface energy coatings distributed thereon.
Figure 9B:
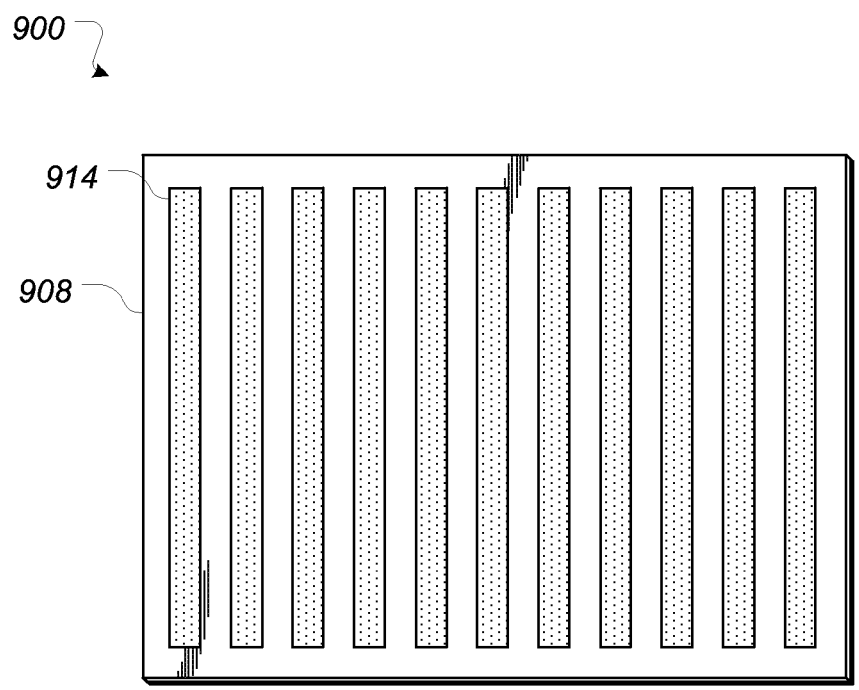
FIG. 9B depicts a top plan view of another sample embodiment of a substrate having a series of parallel columns of high surface energy coatings distributed thereon.

One may appreciate that the pattern and geometry of the deposit areas may differ from embodiment to embodiment. For example, FIG. 9A depicts a top plan view of one sample embodiment of a substrate stack 900 having a grid of deposit areas 914, whereas FIG. 9B depicts a top plan view of another sample embodiment of a substrate stack 900 having a series of parallel columns of deposit areas 914. Although two examples are given, one may appreciate that any suitable shape or distribution of deposit areas is contemplated. For example, in certain embodiments the contact area may form an arbitrary shape.

Figure 10:
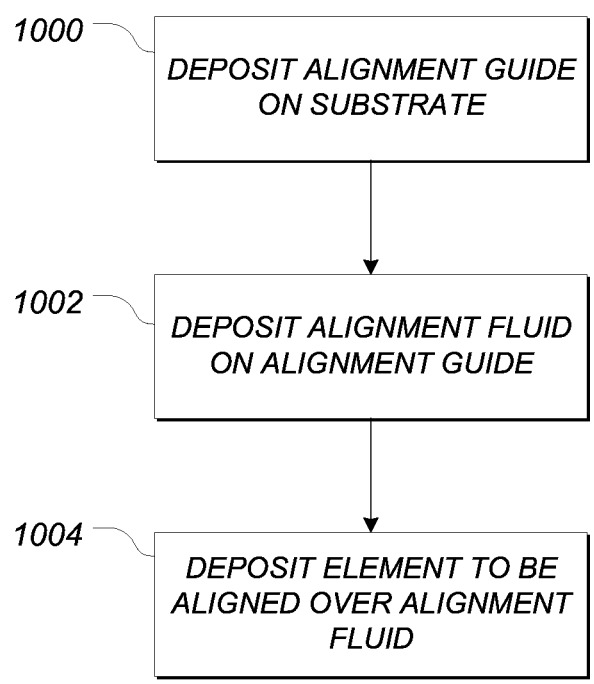
FIG. 10 depicts a sample flow chart of a sample method of orienting and aligning discrete parts during manufacture.

FIG. 10 depicts a sample flow chart of a sample method of orienting and aligning discrete parts during manufacture. The process may begin at 1000 in which an alignment guide may be deposited on a selected substrate. As described, the alignment guide may include multiple deposit areas sized and positioned to receive and encourage a particular element to orient in a desired direction.

Next at 1002, alignment fluid may be deposited on the alignment guide. As described, individual volumes of alignment fluid may be deposited at each individual deposit area. For example, a first volume of alignment fluid may be deposited at a first deposit area and a second volume of alignment fluid may be deposited at a second deposit area. The operation of "depositing" the elements generally includes the alignment operation performed by the fluid on the elements.

The method may terminate at 1004, after the element to be aligned is deposited over the alignment fluid.

Figure 11:
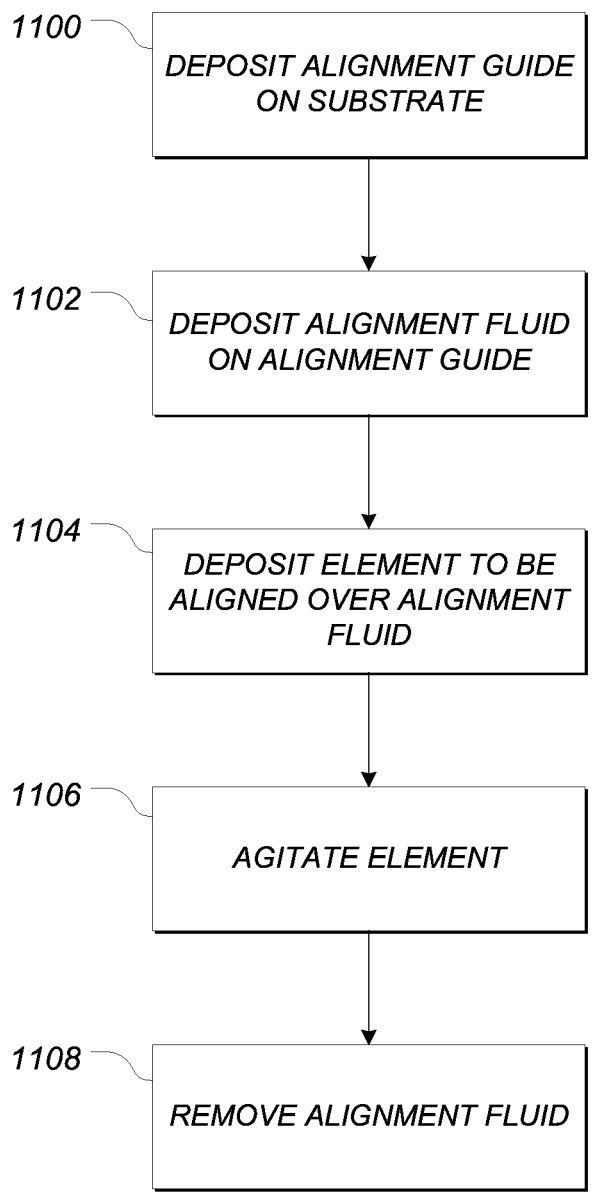
FIG. 11 depicts a sample flow chart of an alternate sample method of orienting and aligning discrete parts during manufacture.

In alternate embodiments, additional or fewer steps may be desired to complete methods and techniques related to the embodiment as illustrated in FIG. 10. For example, FIG. 11 depicts a sample flow chart of an alternate sample method of orienting and aligning discrete parts during manufacture. Similarly, the process may begin at 1100 in which an alignment guide may be deposited on a selected substrate. Next at 1102, alignment fluid may be deposited on the alignment guide. Next, at 1104, the element to be aligned is deposited over the alignment fluid. Thereafter at 1106, the element may be agitated to encourage the element to align with the alignment area. The element may be agitated in any number of suitable ways. For example, in certain embodiments the substrate may be agitated or, in other examples the element may be agitated while the substrate remains stationary. In either case, agitation may be accomplished in a number of suitable ways. For example, knocking, vibration, sonication, magnetic agitation, chemical agitation, airburst agitation, and so on. After agitation, the alignment fluid may be removed at 1108.

Figure 12:
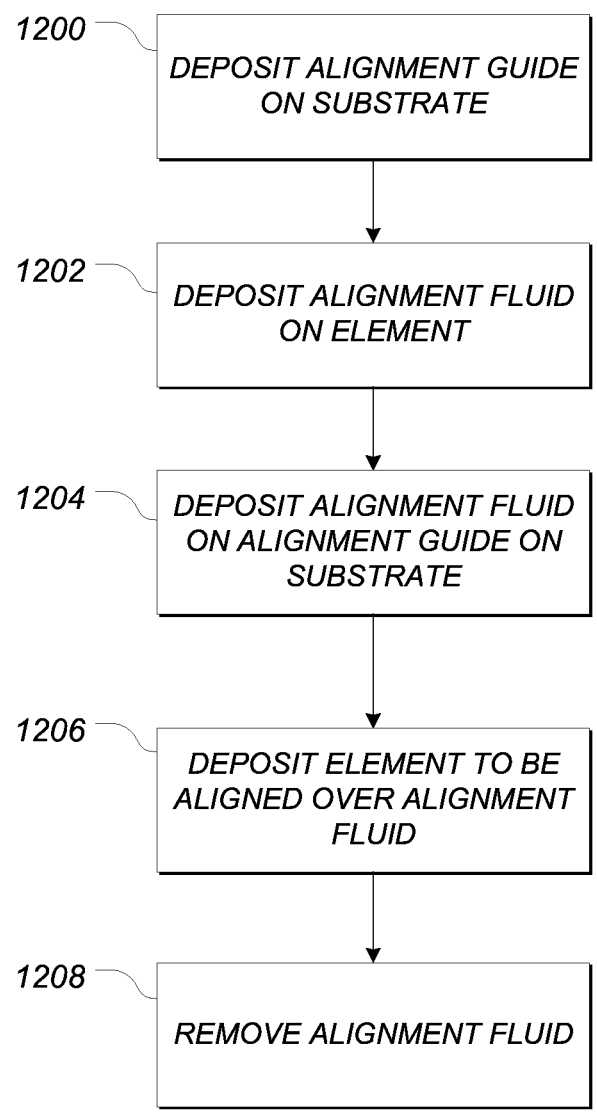
FIG. 12 depicts a sample flow chart of a sample method of orienting and aligning discrete parts during manufacture.

In alternate embodiments, additional or fewer steps may be desired to complete methods and techniques related to the embodiment described herein. For example, FIG. 12 depicts a sample flow chart of another sample method of orienting and aligning discrete parts during manufacture. Similarly, the process may begin at 1200 in which an alignment guide may be deposited on a selected substrate. Next at 1202, alignment fluid may be deposited on an element to be aligned. Next at 1204, alignment fluid may be deposited on the alignment guide. Next, at 1206, the element to be aligned is deposited over the alignment fluid. Thereafter, the alignment fluid may be removed at 1208.

Figure 13:
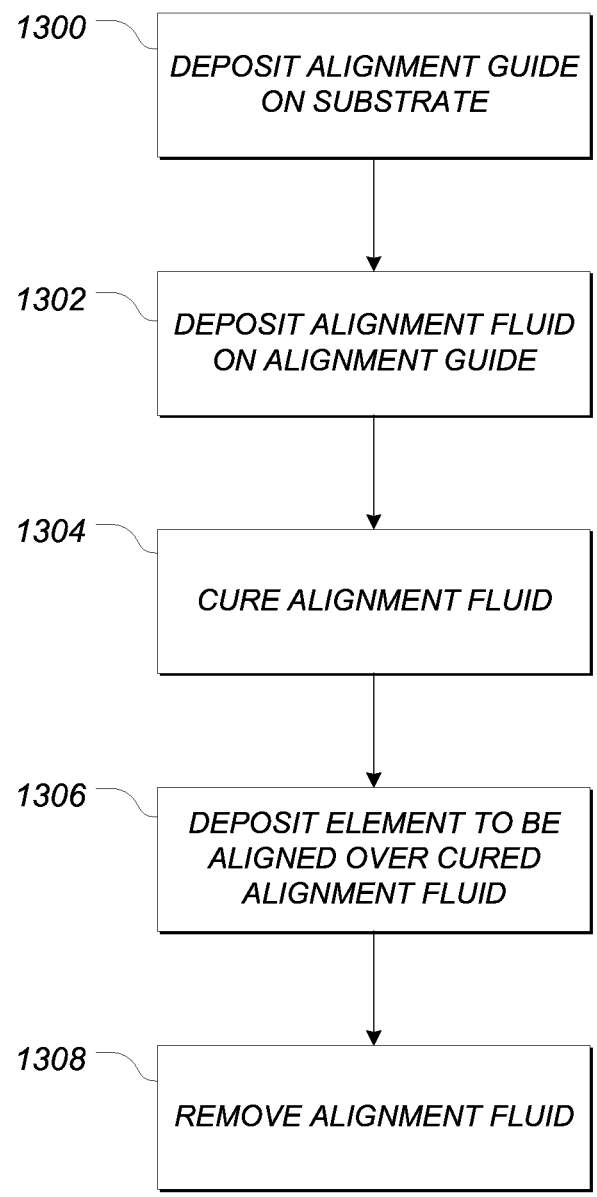
FIG. 13 depicts a sample flow chart of a sample method of orienting and aligning discrete parts during manufacture.

In alternate embodiments, additional or fewer steps may be desired to complete methods and techniques related to the embodiment described herein. For example, FIG. 13 depicts a sample flow chart of an alternate method of orienting and aligning discrete parts during manufacture. Similarly, the process may begin at 1300 in which an alignment guide may be deposited on a selected substrate. Next at 1302, alignment fluid may be deposited on the alignment guide. Thereafter at 1304, the alignment fluid may be cured to permanent or temporary rigidity. After curing, at 1306, the element to be aligned is deposited over the alignment fluid after which the alignment fluid may optionally be removed at 1308. In other embodiments, the alignment fluid can be cured in a curing process to lock the component in place.

One may appreciate that although many embodiments are disclosed above, that the operations and steps presented with respect to methods and techniques described herein are meant as exemplary and accordingly are not exhaustive. One may further appreciate that alternate step order or, fewer or additional steps may be required or desired for particular embodiments.

As described herein, components aligned with methods and systems disclosed above can be mechanical elements, electrical elements, MEMS elements, and so on. Similarly, one may align any shape element by controlling the configuration of fluid droplets and the configuration of attracting or repelling coatings on the components.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

We claim:

1. A method of positioning a component on a surface of a substrate, the method comprising:

applying a coating to the surface, to define a first deposit region, a second deposit region, and an alignment area between the first and second deposit regions, the alignment area configured to interface with and electrically couple to the component;

depositing an alignment medium onto the first and second deposit areas to form a first volume of alignment fluid and a second volume of alignment fluid; and positioning the component above the alignment area and between the first and second volumes of alignment fluid, wherein the component has a tapered shape and only interfaces with and electrically couples to the alignment area in the first orientation.

2. The method of claim 1, wherein the first and second volumes of alignment fluid align the component with the alignment area.

3. The method of claim 1, wherein:
the coating comprises a hydrophilic material; and
the alignment medium comprises water.

4. The method of claim 1, wherein:
the coating comprises an oleophilic material; and
the alignment medium comprises and oil.

5. The method of claim 1, wherein the alignment medium is performed by a vapor deposition process.

6. The method of claim 1, wherein depositing the alignment medium comprises:
immersing the surface in a bath of alignment medium; and
removing the substrate from the bath of alignment medium.

7. The method of claim 1, further comprising:
disposing a low surface energy coating upon at least one external surface of the component, wherein the low surface energy coating comprises one of the group consisting of hydrophobic and oleophobic coatings.

8. The method of claim 1, further comprising:
determining whether the component is not aligned with the alignment area; and in response, agitating the substract.

9. The method of claim 1, further comprising removing the alignment medium after determining that the component is in contact with the alignment area.

10. The method of claim 1, further comprising curing the alignment medium after determining that the component is in contact with the alignment area.

11. the method claim 1, further comprising:
agitating the substrate until the component is in contact with the alignment area.

12. A method of positioning a component on a surface of a substrate, the method comprising:
applying a first coating to a selected area of the surface, the coating defining at least a portion of the perimeter of an alignment area;

applying a second coating to an exterior surface of the component;

depositing a first fluid on the first coating to define a first bead of fluid;

depositing a second fluid on the second coating to define a second bead of fluid; and positioning the component above the alignment area and adjacent to the first bead of fluid such that the first bead of fluid and the second bead of fluid coalesce.

13. The method of claim 12, wherein the first coating comprises a hydrophilic coating and the first fluid comprises water.

14. The method of claim 12, wherein the coating comprises an oleophilic coating and the second fluid comprises an oil.

15. The method of claim 12, wherein the first fluid is deposited using a vapor deposition process.

16. The method of claim 12, wherein the second fluid is deposited by immersing and removing the substrate in a bath of second fluid.

17. The method of claim 12, further comprising:
determining that the component not aligned with the alignment area, and in response, agitating the substrate.

18. The method of claim 12, further comprising removing the first fluid after determining that the component is in contact with the alignment area.

19. A method of positioning a component on a surface of a substrate, the method comprising:
applying a coating to the surface to define a grid pattern around a periphery of a target alignment area, the grid pattern comprising:
a first deposit area adjacent to the first portion of the periphery;
a second deposit area adjacent to a second portion of the periphery; and
a third deposit area adjacent to a third portion of the periphery;

defining an alignment guide over the target alignment area by forming a first volume of fluid on the first deposit area, a second volume of fluid on the second deposit area, and a third volume of fluid on the third deposit area, the alignment guide defined by the space separating the first, second, and third volumes of fluid;

positioning the component over the alignment guide; and
agitating the substrate until the component is in contact with the target alignment area.

20. The method of claim 19, wherein the component has a tapered shaped.

21. the method of claim 19, wherein the component is a light emitting diode.

* * * * *